United States Patent [19]
Barclay et al.

[11] Patent Number: 5,015,969
[45] Date of Patent: May 14, 1991

[54] AMPLIFIER CONTROL SYSTEM

[75] Inventors: Clay Barclay; Larry Shallenburger, both of Elkhart, Ind.

[73] Assignee: Crown International, Inc., Elkhart, Ind.

[21] Appl. No.: 448,523

[22] Filed: Dec. 11, 1989

[51] Int. Cl.$^5$ ............................................... H03G 3/30
[52] U.S. Cl. ........................................ 330/284; 330/2
[58] Field of Search ............... 330/2, 124, 149, 278, 330/279, 284, 298, 207 P; 364/221.7, 222.2

[56] References Cited
U.S. PATENT DOCUMENTS
4,794,343 12/1988 Yang ...................................... 330/2

*Primary Examiner*—Steven Mottola
*Attorney, Agent, or Firm*—Todd A. Dawson

[57] ABSTRACT

A control system for an audio amplifier including a control module interconnected by an edge connector to an amplifier to monitor status signals and the audio input and output signals from the amplifier. The control module passes serial data to an interface which interconnects the plurality of control modules and amplifiers to a single host computer. The host computer receives data from the interface and transmits instructions to the interface for routing to the specific amplifier control module to control the amplifier's gain along with other audio functions and a remote power supply. The control module can be set to run in a stand alone mode to regulate the amplifiers thermal dynamic response to the audio signals and prevent thermal clipping.

6 Claims, 3 Drawing Sheets

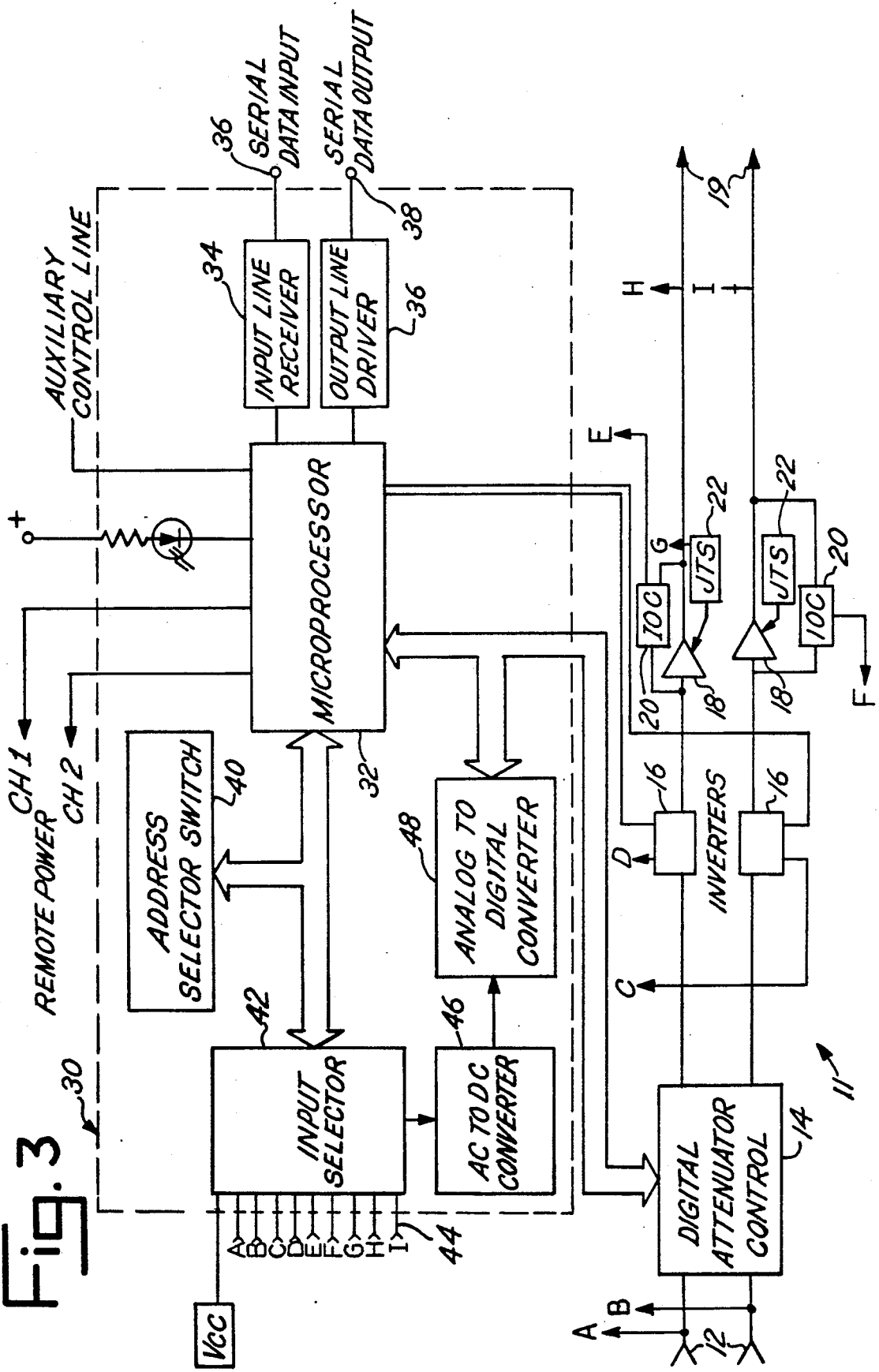

AMPLIFIER CONTROL SYSTEM

SUMMARY OF THE INVENTION

This invention relates to amplifier controls and has specific relevance to a computer control system for power amplifiers.

The control system of this invention uses a control module having an on-board cpu which is connected by edge connectors into the amplifier's circuitry for monitoring the amplifier's status signals as well as the audio input and output from the amplifier. Each control module is provided with serial input and output connecters for transferring serial data into and out of the control module. The control system of this invention further includes an interface having a plurality of serial line drivers and receivers which may be selectively connected to a microprocessor within a host computer. The host computer monitors the information from the separate control modules on each amplifier and manipulates the data into graphic displays so that the graphic representation of the computer status and operation characteristics may be viewed by the user. Through graphics displays, the user can monitor the junction temperature simulation signal with respect to audio output levels. The input/output comparator signal is also visually depicted on the computer screen.

The control module of this invention includes a microprocessor which monitors the amplifiers's junction temperature simulation circuit, input/output comparator, rail voltage, and the audio signal at the input and output stages. The module, under command of the host computer, uses common user input technology and has the ability to turn an audio channel of the amplifier on or off, adjust the level of the digital attenuators, invert the audio signal polarity and turn an auxiliary control line on or off. Further, a digital signal presence indicator (DSPI) light may be turned on or off by the module as an aid in trouble shooting a series loop of amplifiers. An 8 bit DIP switch is connected to the microprocessor to provide address information, which along with serial data input and output connectors, allows the module to be serially connected to a plurality of amplifier control modules each having their own separate address for control by the central computer. The control module is preferably arranged on a single printed circuit board which includes an edge connector to allow for easy installation in an amplifier which includes a mating edge connector socket such as those amplifiers sold under the names Com-Tech ™ and Macro-Tech ™ manufactured by Crown International, Inc. of Elkhart, Indiana.

Accordingly it is an object of this invention to provide for a novel amplifier control system.

Another object of this invention is to provide for a control system for amplifiers wherein a control module passes status information from this amplifier to a host computer through a serial interface.

Another object of this invention is to provide a means for controlling a multitude of amplifiers from a central location.

Still another object of this invention to provide a novel control module for an audio amplifier.

Another object of the invention is to provide a control module for an amplifier having an internal microprocessor for automatically controlling amplifier gain.

Other objects of the invention will become apparent upon a reading of the following description taken with the accompanying drawings.

BRIEF DESCRIPTION OF THE DRAWINGS

FIG. 3 is a block diagram of the control module of the invention interconnected to an audio amplifier.

DETAILED DESCRIPTION OF THE PREFERRED EMBODIMENT

The preferred embodiment herein described is not intended to be exhaustive or to limit the application to the precise forms disclosed rather it is chosen and described to enable others skilled in the art to utilize its teachings.

Figure 1:
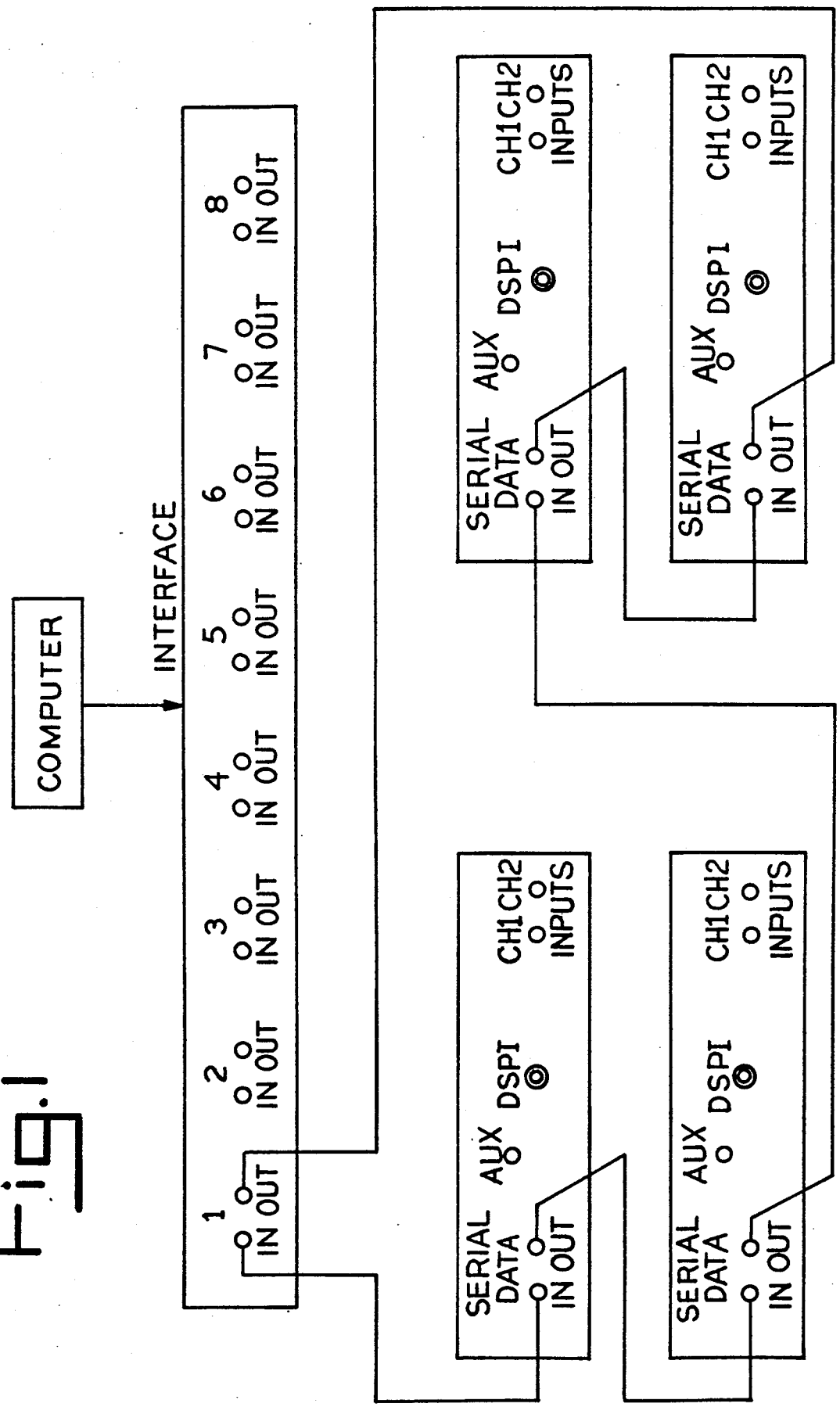
FIG. 1 is a block diagram form of the control system of this invention illustrating a series loop of amplifiers connected to a single interface port.

The control system of this invention as illustrated in FIG. 1 includes a host computer such as an Apple Computer Company MacIntosh ® brand computer connected by a common computer conductor to the interface. The interface of the system includes eight pairs of serial data input and output terminals each pair constitutuing a control zone. As illustrated in FIG. 1, the serial data input and output terminals of a zone (Zone 1 in FIG. 1) are connected to four control modules 10 which are carried by and connected into amplifiers (not shown). Each control module 30 includes serial data input and output connectors, a digital signal presence indication (DSPI) light, audio input channels 1 and 2 and auxiliary voltage output connector designated by AUX. The specific configuration of the module will be discussed later. As illustrated in FIG. 1, the control modules are connected in a serial loop between an input and output terminal of an interface zone. As mentioned previously and described in detail below, each module 30 includes an eight-bit DIP switch which is preset by the user to give address information to the microprocessor within the module. This address allows the host computer to send commands to a specific module 30 within a serial loop. Therefore, each interface zone could have 250 serially connected control modules connected thereto, and with the system illustrated in FIG. 1, the computer and interface with eight zones could be used to control 2000 separate power amplifiers from a remote location. Since only low level digital information is transmitted between the amplifiers and the interface, a common twisted cable can be used instead of expensive audio power cabling which reduces cost to the user.

Figure 2:
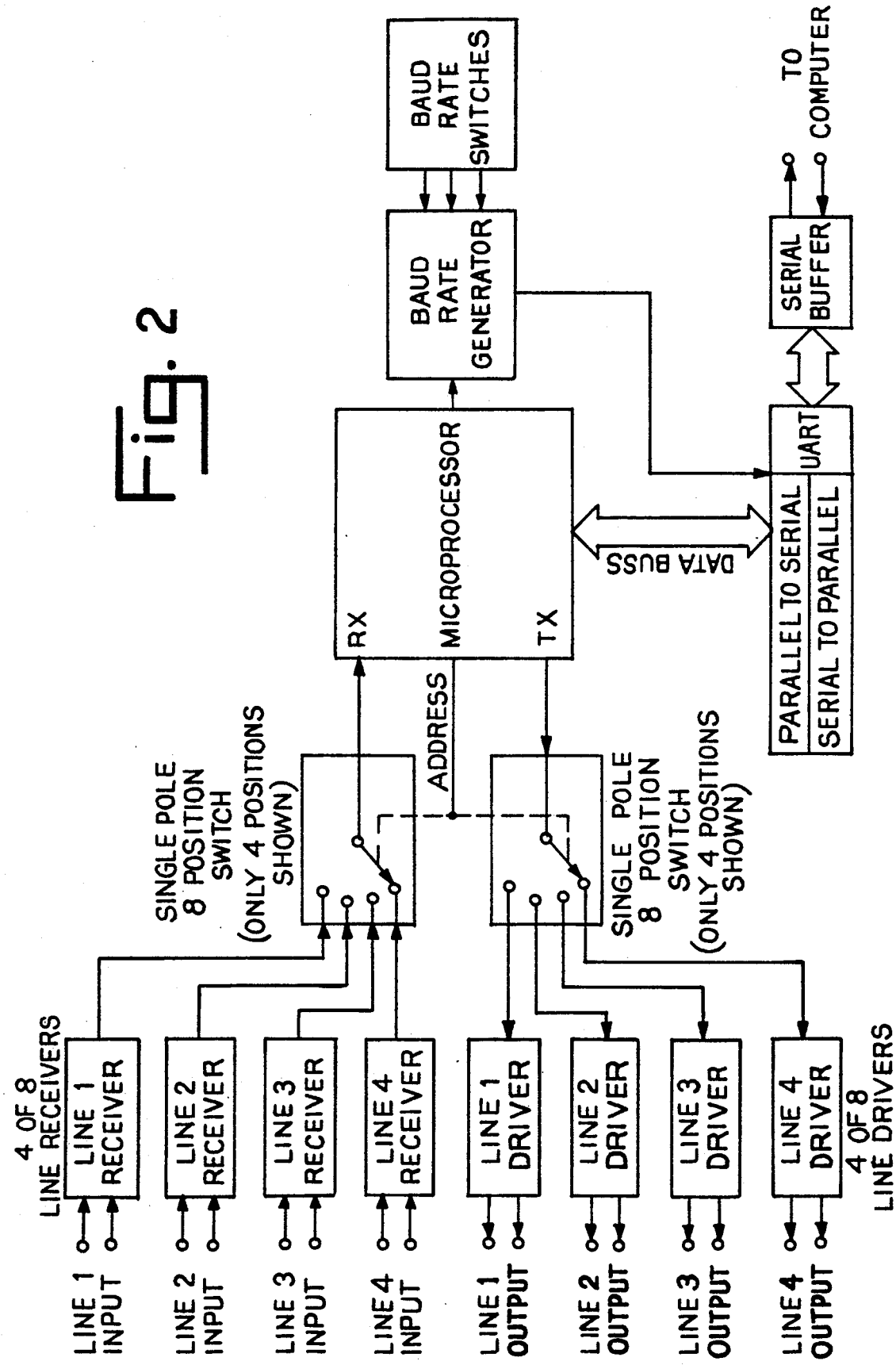
FIG. 2 is a block diagram view of the interface used in the control system of this invention.

A block diagram of the interface of the preferred embodiment is illustrated in FIG. 2. The interface provides a means for the host computer to communicate with the control modules 10 carried within the amplifiers. The eight channels or zones of the interface provide a means for dividing the multiple modules or amplifiers into eight zones, each positioned in a serial loop. As illustrated in FIG. 2, the interface includes a plurality of serial data receivers and a plurality of serial line drivers connected to two single pole eight position switches. (Only four positions are shown in FIG. 2 for illustrative purposes). It should be understood that while the block diagram of FIG. 2 only illustrates four receivers and drivers, eight of each would be required to accommodate the eight zones of interface illustrated in FIG. 1.

Two single pole eight position switches are connected to a microprocessor which receives and transmits the serial data and also controls the position of the two single pole eight position switches. The two single pole eight position switches are ganged so that as illustrated in FIG. 2, serial data is being transmitted over the line 4 driver while the serial data is being received over the line 4 receiver. The microprocessor of the interface communicates with a baud rate generator which is connected to baud rate switches. The baud rate for the interface may be preset by the user by switches. A databuss connects the microprocessor to a parallel to serial and serial to parallel converter which is also connected in a common manner to a universal asyncronous receiver/transmitter commonly referred to as a UART. The UART is connected by bus lines to a serial buffer having input and output terminals for connection to the host computer. Data from the host computer arrives at the serial buffer and is passed to the serial input of the UART which changes the data from serial to parallel before proceeding to the microprocessor. The data, which is a command sequence, is loaded into memory until the last bite of data as determined by the termination character arrives. The data bites are all then dumped by the microprocessor out the serial output port of the microprocessor (indicated by TX). The output and input selectors (the two single pole eight position switches) are controlled by the microprocessor to select which group of control modules the data will be sent to. The data is then sent to the selected line driver which sends the data through the line output to the serial loop of control modules 10 connected thereto. Since each control module on a specific zone has a different address as determined by its DIP switch, the data transmitted by the microprocessor having address information will be received and acted upon only by the control module having the appropriate address. Data from the module is sent by serial output port and received by the appropriate line driver receiver into the input selector and finally into the serial data input pin of the microprocessor (designated by RX). The microprocessor will store the data in memory until the end of data character is received at which point the data will be sent to the parallel to series converter as a parallel signal. The converter converts the signal into a serial signal and outputs the serial signal to the UART which transmits the signal to the serial buffer. The serial buffer sends the data to the host computer for manipulation and processing in a common manner for display on the video terminal (not shown).

A common power amplifier 11 is illustrated in FIG. 3 in block diagram form as including audio input terminals 12 connected to a digital attenuator 14. The outputs of the digital attenuator 14 are connected to the input of inverter circuits 16. The outputs of inverter circuits 16 are connected to the input of amplifiers 18. The output of amplifiers 18 are connected to audio output terminals 19. An input/output comparator (IOC) 20 is connected to the input and output of each amplifier 18. Each IOC 20 includes an output which is connected to an LED (not shown) mounted to the amplifier housing (not shown). The IOC 20 monitors the input and output of amplifier 18 and illuminates a LED housed on the front panel to indicate to the user that signal fidelity is corrupted past a predetermined amount. A junction temperature simulation (JTS) circuit 22 is connected to each amplifier 18 to monitor the input and output audio signal. A more complete and thorough understanding of the circuitry and functioning of junction temperature simulation may be had by a reading of U.S. Letters Pat. No. 4,330,809 issued May 18, 1982, which is incorporated herein by reference. Electrical conductors connect audio inputs 12, digital attenuator control 14, inverter 16, each IOC 20, JTS 22 and each audio output 20 to a common socket (not shown) for accomodating an edge connector of the module. An amplifier configured as described above is known in the industry and is manufactured by Crown International, Inc. under the trade names ComTech TM and MacroTech TM.

Control module 30 of this invention as illustrated in block form includes a microprocessor 32 having an input line receiver 34 connected between a serial data input terminal 36 and the serial input lead of microprocessor 32. Similarly, an output line driver 36 is connected between a serial data output connector 38 and the serial data output lead of the microporcessor. An eight bit DIP switch 40 is connected by a databuss to the input lines of the microprocessor to provide address information. An input selector 42 is connected between the input lines of the microprocessor and a plurality of edge connector terminals 44. An AC to DC converter 46 is connected between an output of selector 42 and the input of an analog to digital converter 48. The outputs of converter 48 are connected by a bus connector to a plurality of input/output leads of the microprocessor.

If the eight bit DIP switch is set to address 0000 0000 the module will function as a stand alone unit without connection to the interface or host computer. As a stand alone unit, a user may adjust the gain of the amplifier and thereby the amplitude of the audio output in a common manner. Control module 30 through its interconnection with power amplifier 10 monitors the JTS and IOC circuits of the amplifier 10 as well as the voltage supply to the power amp as mentioned above. If during operation, the amplifiers JTS circuitry indicates to the control module that the amplifier is nearing thermal clipping, the module will adjust the gain of the amplifier down a small amount to prevent the audio output signal from being clipped or distorted.

It should be understood that the invention is not to be limited to the precise form disclosed but rather may be modified within the scope of the appended claims.

We claim:

1. A control for an amplifier having analog input and output signals, said control comprising: means carried by said amplifier for monitoring said amplifier analog signals, said means for monitoring including means for converting said analog signals into digital information, computer means operatively associated with said monitoring means for analyzing said digital information, said computer means further including output means for sending instructions from said computer means to said means for monitoring, said means for monitoring including an amplifier control means responsive to said instructions for adjusting said analog singals, wherein said computer means is remote from said amplifier and includes display means for displaying said digital information and input means for accepting said instructions, and an interface means having a plurality of control zones connected between a plurality of said amplifiers and said remote computer means, said interface means for transferring said instructions from said computer means to said amplifier, said means for monitioring including an address member constituting means for identifying said amplifier from other amplifiers connected to one of said zones, said instructions including monitoring means address/information.

2. The control of claim 1 wherein said digital information includes information relating to the thermal characteristics of said amplifier.

3. The control of claim 1 wherein said monitoring means includes a microprocessor operatively connected to said amplifier analog signals, said address member includes a plurality of switches connected to address lines of said microprocessor.

4. The control of claim 3 further including an indicator connected to said microprocessor for indicating the presence of said digital information at said monitoring means.

5. the control of claims 1 and including a voltage source carried by said monitoring means and controlled by said amplifier control means.

6. The control of claim 1 wherein each control zone includes means for sending and receiving digital information, said interface including switch members controlled by a microprocessor operating on instructions received by said computer means for selecting said sending and receiving means of one of said zones.

* * * * *